United States Patent
Jin

(10) Patent No.: US 10,988,028 B2
(45) Date of Patent: Apr. 27, 2021

(54) DC-TO-DC VOLTAGE CONVERTER, VOLTAGE SUPPLY DEVICE, AND DIAGNOSTIC METHOD FOR A DC-TO-DC VOLTAGE CONVERTER

(71) Applicant: Robert Bosch GmbH, Stuttgart (DE)

(72) Inventor: Jiahang Jin, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 28 days.

(21) Appl. No.: 16/495,572

(22) PCT Filed: Mar. 16, 2018

(86) PCT No.: PCT/EP2018/056629
§ 371 (c)(1),
(2) Date: Sep. 19, 2019

(87) PCT Pub. No.: WO2018/177772
PCT Pub. Date: Oct. 4, 2018

(65) Prior Publication Data
US 2020/0023741 A1    Jan. 23, 2020

(30) Foreign Application Priority Data
Mar. 31, 2017   (DE) ...................... 10 2017 205 481.6

(51) Int. Cl.
*H02M 3/335* (2006.01)
*B60L 3/00* (2019.01)
(Continued)

(52) U.S. Cl.
CPC ............. *B60L 3/003* (2013.01); *B60L 3/0069* (2013.01); *B60L 3/04* (2013.01); *B60L 53/22* (2019.02);
(Continued)

(58) Field of Classification Search
CPC ...... H02M 1/32; H02M 3/18; H02M 3/33584; B60L 2240/427; B60L 2240/527;
(Continued)

(56) References Cited

U.S. PATENT DOCUMENTS 5,430,636 A * 7/1995 Kachi .................. H02H 7/1222
363/55
8,797,768 B2 * 8/2014 Asai ........................ B60L 3/003
363/56.04
(Continued)

FOREIGN PATENT DOCUMENTS

| DE | 102014016076 | 8/2015 |
| JP | 2000278802 | 10/2000 |
| JP | 2011188713 | 9/2011 |

OTHER PUBLICATIONS

International Search Report for Application No. PCT/EP2018/056629 dated Jun. 20, 2018 (English Translation, 2 pages).

*Primary Examiner* — Thienvu V Tran
*Assistant Examiner* — Ivan Labo
(74) *Attorney, Agent, or Firm* — Michael Best & Friedrich LLP

(57) ABSTRACT

A diagnosis method for the switching elements in a bidirectional DC-to-DC voltage converter comprising: charging a capacitor in the bidirectional DC-to-DC voltage converter to a predetermined first test voltage, then specifically actuating the switching elements in the bidirectional DC-to-DC voltage converter, and evaluating the voltage in the charged capacitor of the bidirectional DC-to-DC converter to identify a faulty switching element within the switching elements in the bidirectional DC-to-DC voltage converter.

11 Claims, 2 Drawing Sheets

(51) Int. Cl.
*B60L 3/04* (2006.01)
*H02M 1/32* (2007.01)
*H02M 3/18* (2006.01)
*B60L 53/22* (2019.01)
*G01R 31/52* (2020.01)
*G01R 31/26* (2020.01)

(52) U.S. Cl.
CPC .............. *H02M 1/32* (2013.01); *H02M 3/18* (2013.01); *H02M 3/33584* (2013.01); *B60L 2210/10* (2013.01); *B60L 2240/427* (2013.01); *B60L 2240/547* (2013.01); *G01R 31/26* (2013.01); *G01R 31/52* (2020.01)

(58) Field of Classification Search
CPC ........... B60L 2240/547; B60L 2210/10; B60L 2210/12; B60L 2210/14; B60L 2210/30; B60L 2210/40; B60L 2210/42; B60L 3/003; B60L 3/0069; B60L 3/04; B60L 53/22; G01R 19/22
See application file for complete search history.

(56) References Cited

U.S. PATENT DOCUMENTS

| | | | |
|---|---|---|---|
| 2011/0090717 A1* | 4/2011 | Lee .................. | H02M 3/33584 363/21.02 |
| 2011/0175619 A1* | 7/2011 | Bauer .................. | B60L 15/007 324/510 |
| 2011/0260452 A1* | 10/2011 | Ogawa .................. | B60L 50/15 290/31 |
| 2013/0106342 A1* | 5/2013 | Iwata .................. | B60L 8/003 320/101 |
| 2015/0185287 A1* | 7/2015 | Wang .................. | G01R 31/42 324/765.01 |
| 2015/0288201 A1* | 10/2015 | Hatakeyama .......... | B60L 58/15 320/107 |
| 2019/0348837 A1* | 11/2019 | Iyasu .................. | H02M 3/33507 |

* cited by examiner

DC-TO-DC VOLTAGE CONVERTER, VOLTAGE SUPPLY DEVICE, AND DIAGNOSTIC METHOD FOR A DC-TO-DC VOLTAGE CONVERTER

BACKGROUND OF THE INVENTION

The present invention relates to a diagnostic method for a DC-to-DC voltage converter, to a DC-to-DC voltage converter and to a voltage supply device having a DC-to-DC voltage converter. The present invention relates in particular to diagnosing bidirectional DC-to-DC voltage converters.

Document DE 10 2014 016 076 A1 discloses a DC-to-DC voltage converter for a motor vehicle that comprises a high-voltage circuit having a variable high or DC voltage and a low-voltage circuit having a low-voltage DC voltage. The high-voltage circuit and the low-voltage circuit are coupled to one another by way of the DC-to-DC voltage converter.

In motor vehicles having an electric or hybrid drive, the electrical energy for the electric drive is provided by a high-voltage battery. At the same time, many motor vehicles have electrical devices that require constant low voltages. In this case, the high voltages of the electric drive system are generally considerably higher than the low voltages of the other electrical consumers. In order also to supply the low-voltage devices with energy from the high-voltage system and possibly also to charge a battery on the low-voltage side, a circuit arrangement is therefore used that makes it possible to transfer electrical energy between the high-voltage side and the low-voltage side.

For such a DC-to-DC voltage converter, as is used for example between a high-voltage side and a low-voltage side of an electric or hybrid vehicle, to operate correctly, it should be ensured that the components of this DC-to-DC voltage converter, in particular the switching elements that are used in this respect, are operating correctly.

SUMMARY OF THE INVENTION

The present invention discloses a diagnostic method for a bidirectional DC-to-DC voltage converter, a DC-to-DC voltage converter and a voltage supply device for an electric or hybrid vehicle.

What is accordingly provided is:

A diagnostic method for a bidirectional DC-to-DC voltage converter. The DC-to-DC voltage converter has a first DC voltage terminal and a second DC voltage terminal. The DC-to-DC voltage converter comprises a first capacitor and a first full bridge at the first DC voltage terminal. The DC-to-DC voltage converter comprises a second full bridge at the second DC voltage terminal. The first full bridge and the second full bridge may be coupled to one another by way of a transformer or the like. The full bridges, in particular the first full bridge, comprise two half bridges each having a first switching element and a second switching element. The method comprises the steps of providing a first DC voltage at the second DC voltage terminal of the DC-to-DC voltage converter and of opening all of the first switching elements and all of the second switching elements in the first full bridge of the DC-to-DC voltage converter. The method furthermore comprises a step of charging the first capacitor to a predetermined first test voltage. The first capacitor is in this case charged by driving the second full bridge to the predetermined first test voltage. The method then comprises a step of closing a first switching element in the first full bridge and then detecting a faulty second switching element if the electric voltage across the first capacitor drops by more than a predefined first voltage value within a predetermined first time interval following the closure of the first switching element. If a faulty second switching element has been detected, the method may then possibly be ended. The method furthermore comprises a step of opening the closed first switching element in the first full bridge and a step of closing a second switching element in the first full bridge. The method then comprises a step of detecting a faulty first switching element if the electric voltage across the first capacitor drops by more than a predefined second voltage value within a predetermined second time interval following the closure of the second switching element. If neither a faulty first switching element nor a faulty second switching element is detected, then the first and second switching elements in the full bridge may be classed as fault-free.

What is furthermore provided is:

A DC-to-DC voltage converter for a bidirectional DC-to-DC voltage conversion between a first DC voltage terminal and a second DC voltage terminal. The DC-to-DC voltage converter comprises a first capacitor, a first full bridge, a second full bridge and a controller. The first full bridge and the second full bridge may be coupled to one another by way of a transformer or the like. The first capacitor is electrically coupled to the first DC voltage terminal of the DC-to-DC voltage converter. The first full bridge is likewise electrically coupled to the first DC voltage terminal. The first full bridge comprises two half bridges each having a first switching element and a second switching element. The second full bridge is electrically coupled to the second DC voltage terminal. The controller is designed to open the first switching elements and the second switching elements in the first full bridge and to charge the capacitor by driving the second full bridge at a predetermined first test voltage and then to close one of the first switching elements in the first full bridge. The controller is furthermore designed to detect a faulty second switching element in the first full bridge if the electric voltage across the first capacitor drops by more than a predefined first voltage value within a predetermined first time interval following the closure of the first switching element. The controller is furthermore designed to then open the closed first switching element in the first full bridge and to close a second switching element in the first full bridge and to detect a faulty first switching element if the electric voltage across the first capacitor drops by more than a predefined second voltage value within a predetermined second time interval following the closure of the second switching element. If a faulty second switching element should already have been detected beforehand, then the detection of a faulty first switching element and the previous opening of the first switching element and the closure of the second switching element may be omitted.

What is further provided is:

A voltage supply device for an electric or hybrid vehicle having a high-voltage on-board system, a low-voltage on-board system and a DC-to-DC voltage converter according to the invention. The high-voltage on-board system is designed to provide electrical energy at a first predetermined electric voltage. The low-voltage on-board system is designed to provide electrical energy at a second predetermined electric voltage. The first DC voltage terminal of the DC-to-DC voltage converter is able to be electrically coupled to the high-voltage on-board system. The second DC voltage terminal of the DC-to-DC voltage converter is electrically coupled to the low-voltage on-board system. The high-voltage on-board system may be in particular an on-board system for supplying a voltage to an electric drive system in the electric or hybrid vehicle. The low-voltage on-board system may be an on-board system for supplying electrical consumers. The low-voltage on-board system may in particular be operated in the region of 12 volts, 24 volts or 48 volts.

Advantages of the Invention

The present invention is based on the finding that a faulty switching element in a DC-to-DC voltage converter, in particular on a high-voltage side of a DC-to-DC voltage converter, may possibly not enable a reliable electrical disconnection. In this case, an electrical connection between the terminals of the switching element is at least partly maintained even when the switching element should be open. During operation of the DC-to-DC voltage converter, an undesired electrical connection may in this case be produced by way of such a faulty switching element, which undesired electrical connection may possibly lead to a short circuit. As a result of such a short circuit, it is possible for high electric currents to flow, these being able to lead to further damage and possibly to a thermal event.

The present invention is therefore based on the concept of taking this finding into consideration and providing a diagnosis for the switching elements of a DC-to-DC voltage converter, in particular for the switching elements on the high-voltage side of a DC-to-DC voltage converter. If such a faulty switching element in the DC-to-DC voltage converter is detected early, it is then possible to initiate measures that are able to prevent further dangerous operating states, such as for example a short circuit and a thermal event connected thereto. The safety of the DC-to-DC voltage converter and therefore of the entire system is thereby able to be improved.

To diagnose the DC-to-DC voltage converter, the electrical energy that is used may in this case be limited in particular to an extent such that the components that are involved are not excessively loaded during the diagnosis. Faulty switching elements are thereby able to be identified without further components suffering in the process.

According to one embodiment, the steps of opening the closed first switching element, of closing an open second switching element and of detecting a faulty first switching element are performed only if no faulty second switching element has been detected beforehand. If a faulty second switching element has already been detected beforehand, this means that correct operation of the DC-to-DC voltage converter is not possible and thus that fault-free operation of the DC-to-DC voltage converter is not able to be implemented. A fault notification may therefore already be output without further diagnostic steps having to be performed.

According to one embodiment, the method comprises a step of charging the first capacitor to a predetermined second voltage after the closed first switching element has been opened. In particular, the predetermined second voltage may correspond for example to the predetermined first voltage. Even after the second switching elements have been checked, the first capacitor is thereby able to be recharged to an electric voltage that allows reliable checking of the first switching elements. The charging of the first capacitor following the checking of the second switching elements may possibly only be performed if the electric voltage across the first capacitor has dropped below a predefined limit value.

According to one embodiment, the predetermined first voltage and/or possibly also the predetermined second voltage to which the first capacitor is charged is determined depending on a maximum forward current, a maximum operating temperature and/or a maximum heat dissipation of the first switching elements and/or of the second switching elements. It is thereby able to be ensured that the switching elements are not overloaded during the check, even in the case of a fault. Possible damage to further components is thereby able to be avoided.

According to one embodiment, the value of the first test voltage to which the first capacitor is charged before the switching elements are checked is greater than the value of the first DC voltage that is provided at the second DC voltage terminal. The switching elements on the high-voltage side of the DC-to-DC voltage converter are thereby able to be checked by providing a lower voltage on the low-voltage side of the DC-to-DC voltage converter. The electric voltage to which the first capacitor is charged in the process may correspond for example to an electric voltage that is present in a DC voltage system to which the DC-to-DC voltage converter is able to be coupled at the first DC voltage terminal. As an alternative, the electric voltage to which the first capacitor is charged may also be lower than the electric voltage of the DC voltage system to which the first DC voltage terminal is able to be coupled.

According to one embodiment, the method comprises a step of activating the DC-to-DC voltage converter if no faulty first switching element and no faulty second switching element has been detected. It is thereby able to be ensured that the DC-to-DC voltage converter is operated only when a check has been performed beforehand on the switching elements in the DC-to-DC voltage converter.

According to one embodiment of the DC-to-DC voltage converter, the DC-to-DC voltage converter comprises a transformer. The transformer is electrically coupled to the first full bridge by way of a primary side and electrically coupled to the second full bridge by way of a secondary side. A galvanic separation between the first full bridge and the second full bridge is thereby able to be achieved. Furthermore, the voltage level may possibly be set during the DC-to-DC voltage conversion in accordance with the turns ratio of the transformer.

The switching elements of the inverter may in particular be, for example, semiconductor switches, such as for example bipolar transistors with an insulated gate terminal (IGBTs) or MOSFETs.

The above configurations and developments may be combined with one another as desired, where expedient. Further configurations, developments and implementations of the invention also comprise combinations that are not explicitly cited of features of the invention that are described above or below with reference to the exemplary embodiments. A person skilled in the art will in particular in this case also add individual aspects as improvements or additions to the respective basic form of the present invention.

BRIEF DESCRIPTION OF THE DRAWINGS

The present invention is explained in more detail below with reference to the exemplary embodiments indicated in the schematic figures of the drawings. In the figures.

DETAILED DESCRIPTION

Figure 1:
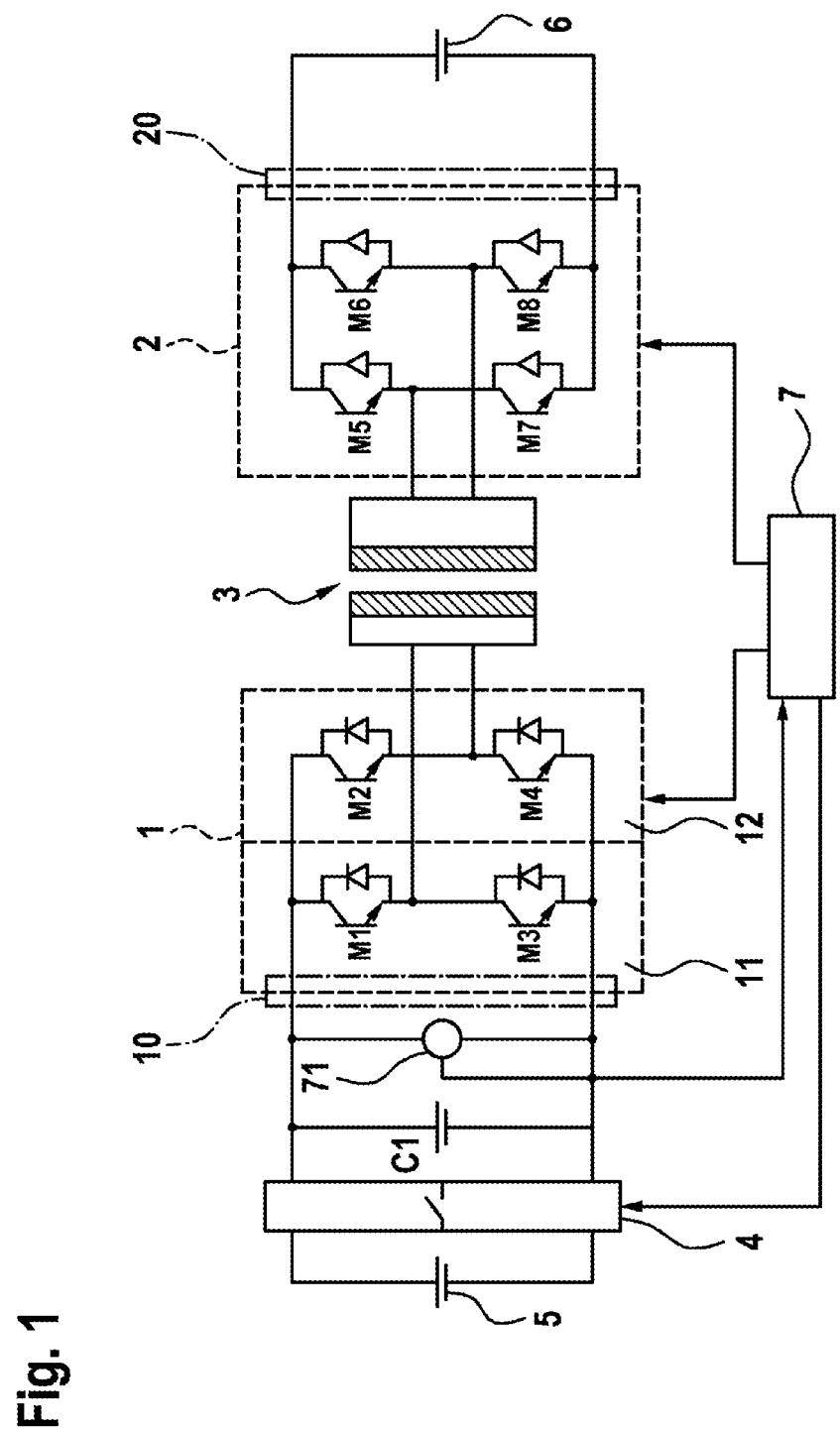
FIG. 1: shows a schematic illustration of a DC-to-DC voltage converter according to one embodiment.

FIG. 1 shows a schematic illustration of a DC-to-DC voltage converter according to one embodiment. The DC-to-DC voltage converter is in particular a bidirectional DC-to-DC voltage converter, that is to say the DC-to-DC voltage converter is able to selectively convert an electric voltage in one direction or the other.

The DC-to-DC voltage converter is able to be electrically connected to a first DC voltage system at a first DC voltage terminal 10. This first DC voltage system may be for example a high-voltage on-board system of an electric or hybrid vehicle. In the embodiment illustrated here, the first DC voltage system is for example represented by a first DC voltage source 5 that is connected to the first DC voltage terminal 10 of the DC-to-DC voltage converter via a circuit breaker 4. A first capacitor C1 and a first full bridge 1 are connected to the first DC voltage terminal 10. The first full bridge 1, in the embodiment illustrated here, comprises two half bridges 11 and 12. The first half bridge 11 has an upper switching element M1 and a lower switching element M3. In the same way, the second half bridge 12 has an upper switching element M2 and a lower switching element M4. The upper switching elements M1 and M2 are connected here for example to the positive connection element of the DC voltage terminal 10. The lower switching elements M3 and M4 are accordingly connected to the negative connection element of the first DC voltage terminal 10. The connecting nodes between the upper switching elements M1 and M2 and the lower switching elements M3 and M4 are connected to one side, for example the primary side, of a transformer 3.

The DC-to-DC voltage converter furthermore comprises a second full bridge 2 that is possibly connected to a second DC voltage terminal 20 together with a second capacitor C2. This second DC voltage terminal 20 may be connected to a further DC voltage system, for example a low-voltage on-board system of an electric or hybrid vehicle. This second DC voltage system is represented here by way of example by the second DC voltage source 6. In the same way as for the first full bridge 1, the second full bridge 2 is connected to another side of the transformer 3, for example a secondary side of the transformer 3. The DC-to-DC voltage converter, in particular the switching elements in the first full bridge 1 and the second full bridge 2, is driven by way of a controller 7.

In order to ensure that the switching elements M1 to M4 of the first full bridge 1 are able to ensure a correct electrical disconnection during operation of the DC-to-DC voltage converter, a diagnosis of the switching elements M1 to M4 may be performed. To this end, for example, an electric voltage across the first capacitor C1 may be detected by way of a voltage sensor 71. By charging the first capacitor C1 to a predefined test voltage and then setting predefined switching states in the first full bridge 1, it is possible to reach a conclusion about the functionality of the switching elements M1 to M4 of the first full bridge 1 from the voltage profile across the first capacitor C1.

The process of diagnosing the switching elements M1 to M4 in the first full bridge 1 will be described below.

During the diagnosis of the switching elements M1 to M4 in the first full bridge 1, the DC-to-DC voltage converter is electrically connected at the second DC voltage terminal 20 to a voltage source 6, for example a low-voltage on-board system of a vehicle. Furthermore, the first DC voltage terminal 10 is decoupled from other electrical consumers. By way of example, the circuit breaker 4 may be opened. To this end, for example, the controller 7 may provide a corresponding drive signal to the circuit breaker 4.

The switching elements M1 to M4 with the half bridges 11 and 12 of the first full bridge 1 are furthermore opened by corresponding driving, for example by way of drive signals from the controller 7.

The second full bridge 2, in particular the switching elements M5 to M8 of the second full bridge 2, is then driven by the controller 7. As a result, an AC voltage is provided on the secondary side of the transformer 3. The AC voltage then induced on the primary side of the transformer 3 is rectified by way of the diodes arranged parallel to the switching elements M1 to M4 of the first full bridge 1 and then charges the first capacitor C1. By virtue of suitable driving of the switching elements M5 to M8 in the second full bridge 2, the first capacitor C1 is thereby able to be charged to a predefined test voltage Up.

After the first capacitor C1 has been charged to the predefined test voltage Up, the driving of the second full bridge 2 is ended.

An upper switching element M1 or M2 in one of the two half bridges 11 or 12 is then closed, whereas the other three switching elements remain open. By way of example, the first switching element M1 may be closed, whereas the switching elements M2 to M4 remain open.

If the lower switching elements M3 and M4 in the half bridges 11 and 12 of the first full bridge 1 are able to ensure sufficient isolation in this switching state, then the first capacitor C1 is not discharged and the electric voltage across the first capacitor C1 will stay kept approximately constant. To this end, the voltage profile across the first capacitor C1 may be detected for example by way of the voltage sensor 71 and provided to the controller 7. If the electric voltage across the first capacitor C1 remains approximately constant during a predefined time interval Δt, that is to say if the electric voltage across the first capacitor C1 drops by less than a predefined threshold value, then it is able to be assumed that the lower switching elements M3 and M4 of the two half bridges 11 and 12 in the first full bridge 1 are able to ensure sufficiently good isolation.

If, on the other hand, the lower switching element M3 in the half bridge 11 is defective, in which half bridge the upper switching element M1 has been closed in a targeted manner, then the electric voltage across the first capacitor C1 will drop very quickly. In this case, this voltage drop is able to be detected by the voltage sensor 71.

If, on the other hand, the upper switching element M1 that has been closed in a targeted manner and the faulty lower switching element M4 are situated in different half bridges 11, 12, then the first capacitor C1 will discharge across the switching element M1 closed in a targeted manner, the primary side of the transformer 3 and the faulty switching element M4. In this case, the first capacitor C1 will also discharge, but more slowly than in the case in which the faulty lower switching element and the upper switching element closed in a targeted manner are situated in the same half bridge. In this case, the voltage across the first capacitor C1 will therefore drop less greatly within a predefined time interval.

It is accordingly able to be established, by evaluating the voltage profile across the first capacitor C1, whether the lower switching elements M3 and M4 ensure sufficient isolation in the open state, or whether one of the two lower switching elements M3 or M4 is not able to ensure sufficient electrical isolation. By comparing the electric voltage across the first capacitor C1 with a first predefined limit value and possibly a second predefined limit value, it is then able to be determined whether one of the two lower switching elements M3 or M4 is faulty. From the level of the voltage drop within the predetermined time interval Δt, it may be possible to draw a conclusion as to which of the two switching elements M3 or M4 is faulty.

If it is established that one of the two lower switching elements M3 or M4 is faulty, then the diagnosis may already be ended at this time. Otherwise, or if the upper switching elements M1 and M3 are additionally also to be checked, a corresponding diagnosis for the two upper switching elements M1 and M2 may then be performed.

To this end, the first capacitor C1 may possibly be recharged. By way of example, the first capacitor C1 may be recharged to the predefined test voltage Up through corresponding driving of the switching elements in the second full bridge 2.

As an alternative, it is also possible, if the electric voltage across the first capacitor C1 still lies above a predefined limit value, to dispense with recharging the first capacitor C1 and to perform the further diagnosis using the remaining residual voltage in the capacitor C1. Independently of whether the first capacitor C1 has or has not been recharged, a lower switching element M3 or M4 is closed, whereas all of the other switching elements are opened, for the diagnosis of the upper switching elements M1 and M2. By way of example, to this end, the lower switching element M3 in the first half bridge 11 may be closed, whereas the upper switching elements M1 and M2 and the other lower switching element M4 remain open.

The voltage profile across the first capacitor C1 is then evaluated again for a predetermined time interval. If the voltage drop across the first capacitor C1 in this case remains below a predefined voltage drop, then the upper switching elements M1 and M2 may also be classed as functional. If, on the other hand, the electric voltage across the first capacitor C1 drops below a predefined limit value, then at least one of the two upper switching elements M1 and M2 is faulty. In this case too, based on the level of the voltage drop across the first capacitor C1 during the predetermined time interval, it is possible to conclude as to whether the upper switching element M1, M2, in the same half bridge 11, 12 in which the lower switching element M3, M4 closed in a targeted manner is also situated, is faulty or whether the lower switching element M3, M4 closed in a targeted manner and the faulty upper switching element M1, M2 are situated in different half bridges 11, 12.

Figure 2:
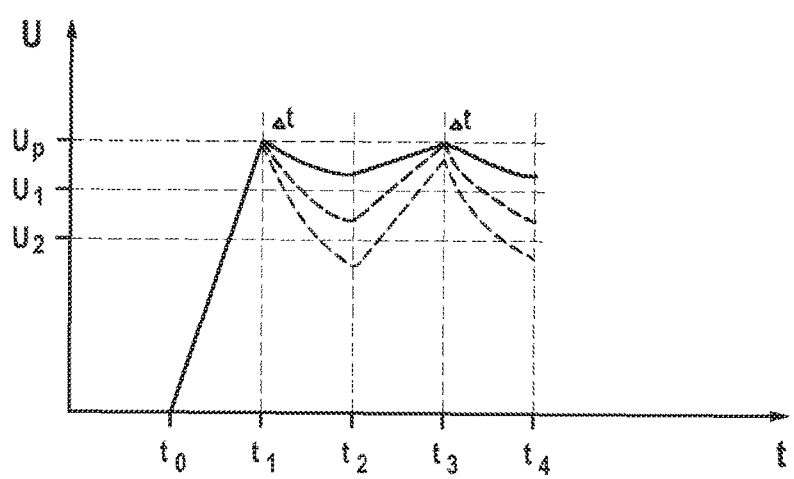
FIG. 2: shows a schematic illustration of a voltage timing diagram of the voltage profile during diagnosis of a DC-to-DC voltage converter according to one embodiment.

FIG. 2 shows a schematic illustration of a voltage time profile during a diagnosis of a DC-to-DC voltage converter according to one embodiment. At the time t0, the capacitor C1 is initially charged to the predefined test voltage Up. At the time t1, the voltage across the first capacitor C1 reaches the predefined test voltage Up. The charging of the first capacitor C1 is then ended and the voltage profile across the first capacitor C1 is monitored. If, after a predetermined time interval Δt, at the time t2, the electric voltage across the first capacitor C1 still lies above a predefined first limit value U1, then the switching elements to be checked may be classed as intact. If the electric voltage across the first capacitor C1 lies below the first predefined limit voltage U1, at least one of the switching elements to be checked is faulty. If the electric voltage across the first capacitor C1 in this case possibly drops below a predefined second voltage value U2, then this is an indication that the faulty switching element and the switching element closed in a targeted manner are situated in the same half bridge.

If no faulty switching element has been classed, then the further switching elements may then also be checked. If for example the lower switching elements M3 and M4 were initially checked, then the upper switching elements M1 and M2 may then be checked. To this end, the electric voltage across the first capacitor C1 may possibly be recharged to the test voltage Up. If this is reached at the time t3, then the voltage profile across the first capacitor C1 is monitored again for a predefined time interval Δt. If the voltage is still above the predefined limit voltage U1 at the time t4, then the switching elements checked in this case are also intact. If, on the other hand, the voltage has fallen below the predefined limit voltage U1, then at least one of the switching elements to be checked is faulty. If the voltage across the first capacitor C1 in the process drops below a lower second limit voltage U2, then this is again an indication that the switching element closed in a targeted manner and the faulty switching element are situated in the same half bridge.

Figure 3:
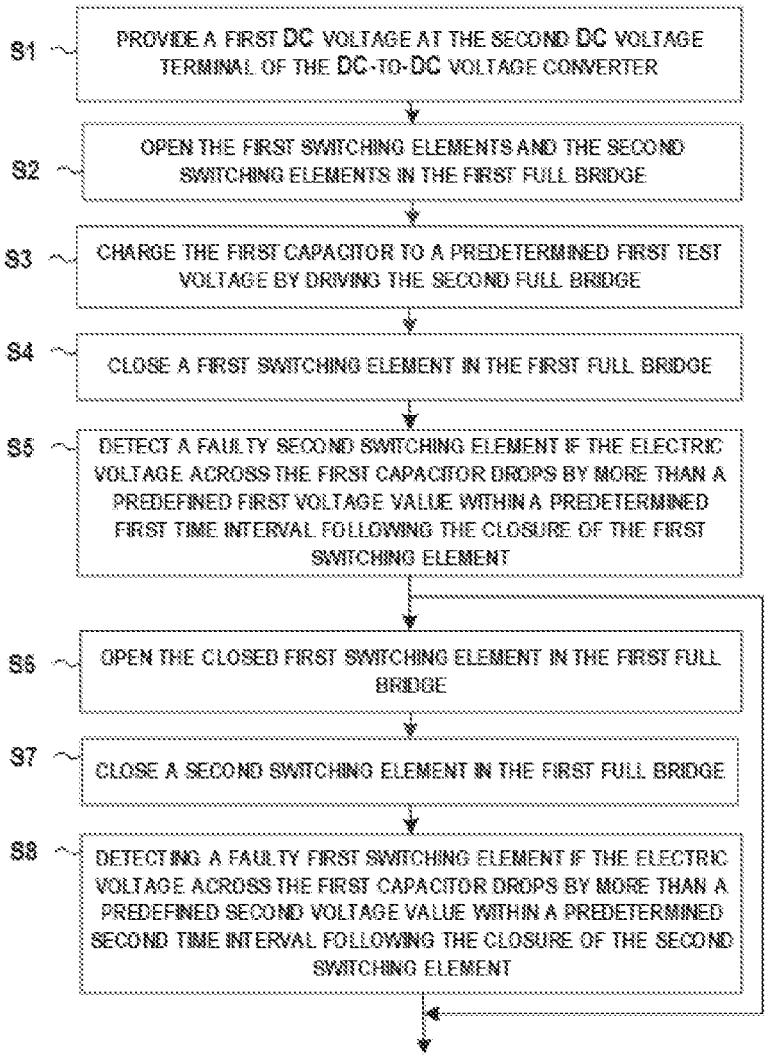
FIG. 3: shows a schematic illustration of a flowchart underlying a diagnostic method for a DC-to-DC voltage converter according to one embodiment.

FIG. 3 shows a schematic illustration of a flowchart underlying a diagnostic method for a DC-to-DC voltage converter according to one embodiment. The diagnostic method described below here essentially corresponds to the diagnosis as has already been described above.

In step S1, a first DC voltage is first of all provided at the second DC voltage terminal 20 of the DC-to-DC voltage converter and, in step S2, all of the first switching elements M1, M2 and second switching elements M3, M4 in the first full bridge 1 of the DC-to-DC voltage converter are opened. In step S3, the first capacitor C1 is then charged to a predetermined test voltage Up by driving the second full bridge 2. Then, in step S4, one of the first switching elements M1, M2 in the first full bridge 1 is closed. If the electric voltage across the first capacitor C1 drops by more than a predefined first voltage value within a predetermined first time interval Δt following the closure of the first switching element M1, M2, then a faulty second switching element is able to be detected in step S5. In this case, the method may be ended since a faulty switching element has already been detected.

If no faulty second switching element M3, M4 has been detected, or the first switching elements M1, M2 are also to be checked in spite of a faulty second switching element M3, M4, then, in step S6, the closed first switching element M1, M2 of the first full bridge 1 is opened and a second switching element M3 or M4 in the first full bridge 1 is closed. If the electric voltage across the first capacitor C1 then drops by more than a predefined voltage value within a predetermined second time interval following the closure of the second switching element M3 or M4 in step S7, then a faulty first switching element M1, M2 is thereby able to be detected in step S8.

In order to protect the components in the DC-to-DC voltage converter, the electric voltage to which the first capacitor C1 is charged may be limited. In particular, the maximum electric voltage to which the first capacitor C1 is charged may be determined depending on a maximum permissible forward current in the switching elements M1 to M4 in the first full bridge 1, a maximum operating temperature and/or a maximum heat dissipation of the switching elements M1 to M4.

In summary, the present invention relates to diagnosing the switching elements in a bidirectional DC-to-DC voltage converter. By charging a capacitor in the DC-to-DC voltage converter and then driving the switching elements in a targeted manner and evaluating the voltage in the charged capacitor of the DC-to-DC voltage converter, it is possible to identify a faulty switching element.

What is claimed is:

1. A diagnostic method for a bidirectional DC-to-DC voltage converter that comprises a first capacitor (C1) and a first full bridge (1) at a first DC voltage terminal (10) and that comprises a second full bridge (2) at a second DC voltage terminal (20), wherein the first full bridge (1) comprises two half bridges (11, 12) each having a first switching element (M1, M2) and a second switching element (M3, M4), comprising the steps of:
   providing (S1) a first DC voltage at the second DC voltage terminal (20) of the bidirectional DC-to-DC voltage converter;
   opening (S2) the first switching elements (M1, M2) and the second switching elements (M3, M4) of the first full bridge (1);
   charging (S3) the first capacitor (C1) to a predetermined first test voltage by driving the second full bridge (2);
   closing (S4) one of the first switching elements (M1, M2) of the first full bridge (1);
   detecting (S5) a faulty second switching element (M3, M4) if the electric voltage across the first capacitor (C1) drops by more than a predefined first voltage value within a predetermined first time interval following the closure of the first switching element (M1, M2);
   opening (S6) the closed first switching element (M1, M2) of the first full bridge (1);
   closing (S7) one of the second switching elements (M3, M4) of the first full bridge (1); and
   detecting (S8) a faulty first switching element (M1, M2) if the electric voltage across the first capacitor (C1) drops by more than a predefined second voltage value within a predetermined second time interval following the closure of the second switching element (M3, M4).

2. The diagnostic method as claimed in claim 1, wherein the steps of opening (S6) the closed first switching element (M1, M2), of closing (S7) the second switching element (M3, M4) and of detecting (S8) a faulty first switching element (M1, M2) are performed only if no faulty second switching element (M3, M4) has been detected.

3. The diagnostic method as claimed in claim 1, comprising a step of charging the first capacitor (C1) to a predetermined second test voltage after the closed first switching element (M1, M2) has been opened.

4. The diagnostic method as claimed in claim 3, wherein the predetermined second voltage to which the first capacitor (C1) is charged is determined depending on a maximum forward current, a maximum operating temperature and/or a maximum heat dissipation of the first switching elements (M1, M2) and/or of the second switching elements (M3, M4) in the first full bridge (1).

5. The diagnostic method as claimed in claim 1, wherein the predetermined first voltage to which the first capacitor (C1) is charged is determined depending on a maximum forward current, a maximum operating temperature and/or a maximum heat dissipation of the first switching elements (M1, M2) and/or of the second switching elements (M3, M4) in the first full bridge (1).

6. The diagnostic method as claimed in claim 1, comprising a step of identifying the faulty switching element (M1 . . . M4) if a faulty first switching element (M1, M2) or a faulty second switching element (M3, M4) has been detected.

7. The diagnostic method as claimed in claim 1, wherein the value of the first test voltage to which the first capacitor (C1) is charged is greater than the value of the first DC voltage that is provided at the second DC voltage terminal (20).

8. The diagnostic method as claimed in claim 1, comprising a step of activating the bidirectional DC-to-DC voltage converter if no faulty first switching element (M1, M2) and no faulty second switching element (M3, M4) has been detected.

9. A DC-to-DC voltage converter for a bidirectional DC-to-DC voltage conversion between a first DC voltage terminal (10) and a second DC voltage terminal (20), having:
   a first capacitor (C1) that is electrically coupled to the first DC voltage terminal (10);
   a first full bridge (1) that is electrically coupled to the first DC voltage terminal (10) and that comprises two half bridges (11, 12) each having a first switching element (M1, M2) and a second switching element (M3, M4);
   a second full bridge (2) that is electrically coupled to the second DC voltage terminal (20); and
   a controller (7) that is designed to open the first switching elements (M1, M2) and the second switching elements (M3, M4) of the first full bridge (1), to charge the first capacitor (C1) by driving the second full bridge (2) at a predetermined first test voltage, to then close one of the first switching elements (M1, M2) in the first full bridge (1) and to detect a faulty second switching element (M3, M4) in the first full bridge (1) if the electric voltage across the first capacitor (C1) drops by more than a predefined first voltage value within a predetermined first time interval following the closure of the first switching element (M1, M2), to then open the closed first switching element (M1, M2) in the first full bridge (1), to close one of the second switching elements (M3, M4) in the first full bridge (1) and detect a faulty first switching element (M1, M2) if the electric voltage across the first capacitor (C1) drops by more than a predefined second voltage value within a predetermined second time interval following the closure of the second switching element (M3, M4).

10. The DC-to-DC voltage converter as claimed in claim 9, having a transformer (3) that is electrically coupled to the first full bridge (1) by way of a primary side and electrically coupled to the second full bridge (2) by way of a secondary side.

11. A voltage supply device for an electric or hybrid vehicle having:
   a high-voltage on-board system that is designed to provide electrical energy at a first predetermined electric voltage;
   a low-voltage on-board system that is designed to provide electrical energy at a second predetermined electric voltage;
   a DC-to-DC voltage converter as claimed in claim 9, wherein the first DC voltage terminal (10) of the DC-to-DC voltage converter is able to be electrically coupled to the high-voltage on-board system, and the second DC voltage terminal (20) of the DC-to-DC voltage converter is electrically coupled to the low-voltage on-board system.

* * * * *